United States Patent
Park et al.

(10) Patent No.: US 8,340,606 B2
(45) Date of Patent: Dec. 25, 2012

(54) DOHERTY AMPLIFIER AND TRANSMITTER USING MIXER

(75) Inventors: Jin-soo Park, Yongin-si (KR); Do-hyung Kim, Seoul (KR); Jin-wook Burm, Goyang-si (KR); Seong-soo Lee, Suwon-si (KR); Heung-bae Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 968 days.

(21) Appl. No.: 11/431,501

(22) Filed: May 11, 2006

(65) Prior Publication Data

US 2006/0293011 A1 Dec. 28, 2006

(30) Foreign Application Priority Data

Jun. 27, 2005 (KR) .......................... 10-2005-0055841

(51) Int. Cl.
*H04B 1/40* (2006.01)

(52) U.S. Cl. ............ 455/118; 455/76; 455/71; 455/315; 455/113; 455/114; 455/84; 455/86; 455/126; 455/260; 455/192.2; 455/263; 455/65; 455/63.1; 455/522; 455/91; 375/302; 375/347; 375/326; 375/285; 375/296

(58) Field of Classification Search .................. 455/118, 455/127.1, 127.3, 253.2, 260, 126, 323; 330/10, 330/129, 136, 290, 251, 151, 295, 52; 375/297, 375/302

See application file for complete search history.

(56) References Cited

U.S. PATENT DOCUMENTS

| | | | | |
|---|---|---|---|---|
| 5,420,541 A * | 5/1995 | Upton et al. | | 330/286 |
| 5,535,247 A * | 7/1996 | Gailus et al. | | 375/297 |
| 5,694,433 A * | 12/1997 | Dent | | 375/297 |
| 5,796,307 A * | 8/1998 | Kumagai et al. | | 330/149 |
| 5,901,346 A * | 5/1999 | Stengel et al. | | 455/126 |
| 6,181,199 B1 * | 1/2001 | Camp et al. | | 330/10 |
| 6,396,341 B1 * | 5/2002 | Pehlke | | 330/10 |
| 6,525,603 B1 * | 2/2003 | Morgan | | 330/52 |
| 6,636,114 B2 * | 10/2003 | Tsutsui et al. | | 330/51 |
| 6,704,551 B2 * | 3/2004 | Riou et al. | | 455/115.1 |
| 6,750,715 B2 * | 6/2004 | Allott et al. | | 330/258 |
| 6,794,933 B2 * | 9/2004 | Gurvich et al. | | 330/52 |
| 6,799,020 B1 * | 9/2004 | Heidmann et al. | | 455/103 |
| 6,947,711 B1 * | 9/2005 | Leyonhjelm | | 455/114.3 |
| 7,042,283 B2 * | 5/2006 | Suzuki et al. | | 330/52 |
| 7,078,976 B2 * | 7/2006 | Blednov | | 330/286 |
| 7,184,491 B2 * | 2/2007 | Suzuki et al. | | 375/297 |

(Continued)

FOREIGN PATENT DOCUMENTS

KR 2001-0093263 A 10/2001

*Primary Examiner* — Matthew Anderson
*Assistant Examiner* — Ganiyu A Hanidu
(74) *Attorney, Agent, or Firm* — Sughrue Mion, PLLC

(57) ABSTRACT

A transmitter and a signal amplifier are provided. The signal amplifier includes a digital-to-analog converter converting an input digital signal into an analog signal, a local oscillator signal generator outputting in-phase and quadrature-phase oscillator signals, a first mixer mixing the analog signal with the in-phase local oscillator signal to output an in-phase high frequency signal, a second mixer mixing the analog signal with the quadrature-phase local oscillator signal to output a quadrature-phase high frequency signal, a main amplifier amplifying the in-phase high frequency signal output from the first mixer, and an auxiliary amplifier amplifying the quadrature-phase high frequency signal output from the second mixer.

23 Claims, 4 Drawing Sheets

U.S. PATENT DOCUMENTS

| | | | |
|---|---|---|---|
| 7,295,074 B2* | 11/2007 | Wong et al. | 330/295 |
| 7,764,120 B2* | 7/2010 | Pengelly | 330/124 R |
| 2001/0016016 A1* | 8/2001 | Eidson et al. | 375/302 |
| 2002/0084847 A1* | 7/2002 | Kim et al. | 330/149 |
| 2003/0199257 A1* | 10/2003 | Wilkinson et al. | 455/127.1 |
| 2004/0038648 A1* | 2/2004 | Matsuura et al. | 455/101 |
| 2004/0160274 A1* | 8/2004 | Gurvich et al. | 330/151 |
| 2004/0266366 A1* | 12/2004 | Robinson et al. | 455/91 |
| 2005/0017802 A1* | 1/2005 | Robinson | 330/151 |
| 2006/0009151 A1* | 1/2006 | Hirai | 455/3.02 |
| 2006/0022740 A1* | 2/2006 | Kim et al. | 327/359 |
| 2006/0099919 A1* | 5/2006 | Sorrells et al. | 455/127.1 |

* cited by examiner

DOHERTY AMPLIFIER AND TRANSMITTER USING MIXER

CROSS-REFERENCE TO RELATED APPLICATIONS

This application claims priority from Korean Patent Application No. 10-2005-0055841 filed Jun. 27, 2005 in the Korean Intellectual Property Office, the disclosure of which is incorporated herein by reference.

BACKGROUND OF THE INVENTION

1. Field of the Invention

Apparatuses and methods consistent with the present invention relate to a transmitter and a signal amplifier, and more particularly, to a transmitter and a signal amplifier using a Doherty structure without a 90° coupler.

2. Description of the Related Art

Complementary metal-oxide semiconductor (CMOS) technology contributes to reducing sizes of chips so as to be advantageous to integration and thus is most suitable for realizing system on a chip (SoC). A radio frequency (RF) performance becomes higher with the reduction in the sizes of the chips. However, a 90° coupler inappropriate for integrated circuit (IC) integration is required to be used in a transmitter using a Doherty structure. Thus, it is difficult to manufacture monotype chips.

FIG. 1 is a schematic block diagram of a related art transmitter using a Doherty structure. Referring to FIG. 1, the related art transmitter includes a digital-to-analog converter (DAC) 10, a base band analog filter 20, a mixer 30, a 90° coupler 40, a main amplifier 50, an auxiliary amplifier 60, and a 90° offset line 70.

The DAC 10 converts a predetermined digital signal into an analog signal.

The base band analog filter 20 filters the connected analog signal by the DAC 110 to remove a high frequency noise component so as to pass only a base band signal and amplifies the base band signal with a gain to provide the amplified signal to the mixer 30.

The mixer 30 mixes the signal transmitted from the base band analog filter 20 with a high frequency local resonator signal generated by a local resonator signal generator (not shown) to output a high frequency signal.

The 90° coupler 40 divides the high frequency signal into a first high frequency signal and a second high frequency signal which is 90° out of phase with the first high frequency signal and outputs the first and second high frequency signals to the main amplifier 50 and the auxiliary amplifier 60, respectively.

The main and auxiliary amplifiers 50 and 60 respectively amplify the first and second high frequency signals with a predetermined gain and output the amplified first and second high frequency signals.

The 90° offset line 70 delays by 90° a phase of the first high frequency signal amplified by the main amplifier 50 so that the first high frequency signal is in phase with the second high frequency signal.

An output signal obtained by coupling the first and second high frequency signals respectively output from the main and auxiliary amplifiers 50 and 60 through the above-described process additionally undergoes impedance matching and noise removing processes and then is transmitted through an antenna (not shown) to a receiver (not shown).

As described above, the Doherty structure divides the high frequency signal output from the mixer 30 into the first and second high frequency signals 90° out of phase with each other and provides the first and second high frequency signals the main and auxiliary amplifiers 50 and 60 in parallel to amplify the first and second high frequency signals.

FIG. 2 is a graph illustrating an output power with respect to an input power in a Doherty structure. Referring to FIG. 2, the Doherty structure generally uses an amplifier amplifying an input power in a full band or saturating an output power if the input power is equal to or more than a predetermined threshold value, for example, an A class or AB class amplifier as a main amplifier and a C class amplifier turned off at a low input voltage and then turned on at a voltage equal to or greater than a predetermined threshold value to amplify an input voltage as an auxiliary amplifier. Thus, the Doherty structure couples an output A1 of the main amplifier to an output A2 of the auxiliary amplifier to produce an output A1+A2 so as to have a highly linear and efficient operation characteristic as shown in FIG. 2.

However, the Doherty structure requires the 90° coupler 40 dividing the high frequency signal output from the mixer 30 into the first and second high frequency signals which are 90° out of phase with each other and providing the first and second high frequency signals to the main and auxiliary amplifier 50 and 60. Further, in the Doherty structure, the 90° coupler 40 is formed on a printed circuit board (PCB) using a transmission line and thus cannot be realized as a an IC or occupies a large area. For example, in a band of 900 MHz, a length of a wavelength is 18.7 cm and. Thus, the 90° coupler 40 cannot be realized as an IC.

The DAC 10, the base band analog filter 20, the mixer 30, and the main and auxiliary amplifiers 50 and 60 are manufactured through a CMOS process. However, the 90° coupler 40 cannot be manufactured through the CMOS process due to its size. Thus, the Doherty structure cannot be realized as a single chip RFIC.

In addition, the 90° coupler 40 formed on the PCB using the transmission line divides a signal with a narrow frequency band into first and second high frequency signals which are 90° out of phase with each other.

SUMMARY OF THE INVENTION

The present invention provides a transmitter and a signal amplifier using a Doherty structure replacing a 90° coupler with a mixer.

According to an aspect of the present invention, there is provided an A signal amplifier including: a digital-to-analog converter converting an input digital signal into an analog signal; a local oscillator signal generator outputting in-phase and quadrature-phase local oscillator signals; a first mixer mixing the analog signal with the in-phase local oscillator signal to output an in-phase high frequency signal; a second mixer mixing the analog signal with the quadrature-phase local oscillator signal to output a quadrature-phase high frequency signal; a main amplifier amplifying the in-phase high frequency signal output from the first mixer; and an auxiliary amplifier amplifying the quadrature-phase high frequency signal output from the second mixer.

The signal amplifier may further include a phase difference compensator compensating for a phase difference between signals respectively output from the main and auxiliary amplifiers.

The signal amplifier may further include a band selection filter passing only a specific band frequency component of a signal output from the phase difference compensator.

The signal amplifier may further include a base band analog filter filtering the analog signal to remove a high frequency noise component.

The digital-to-analog converter, the local oscillator signal generator, the first mixer, the second mixer, the main amplifier, the auxiliary amplifier, and the base band analog filter may be integrated into an integrated circuit.

The main amplifier may operate as one of A and AB class amplifiers, and the auxiliary amplifier may operate as a C class amplifier.

According to another aspect of the present invention, there is provided a transmitter including: a digital-to-analog converter converting an input digital signal into an analog signal; a local oscillator signal generator outputting in-phase and quadrature-phase local oscillator signals; a first mixer mixing the analog signal with the in-phase local oscillator signal to output an in-phase high frequency signal; a second mixer mixing the analog signal with the quadrature-phase local oscillator signal to output a quadrature-phase high frequency signal; a main amplifier amplifying the in-phase high frequency signal output from the first mixer; an auxiliary amplifier amplifying the quadrature-phase high frequency signal output from the second mixer; a phase difference compensator compensating for a phase difference between signals respectively output from the main and auxiliary amplifiers and then coupling and outputting the signals; and an antenna radiating the signal output from the phase difference compensator in the air to transmit the signal to a receiver.

The transmitter may further include a base band analog filter filtering the analog signal to remove a high frequency noise component.

The transmitter may further include a band selection filter passing only a specific band frequency component of the signal output from the phase difference compensator.

The main amplifier may operate as one of A and AB class amplifiers, and the auxiliary amplifier may operate as a C class amplifier.

According to still another aspect of the present invention, there is provided a signal amplifier including: first and second digital-to-analog converters respectively converting input I-channel and Q-channel digital signals into I-channel and Q-channel analog signals; a local oscillator signal generator outputting an in-phase local oscillator signal, a quadrature-phase local oscillator signal, and an inverted phase local oscillator signal; first and second mixers mixing the I-channel analog signal with the in-phase and quadrature-phase local oscillator signals to output I-channel in-phase and quadrature-phase high frequency signals, respectively; third and fourth mixers mixing the Q-channel analog signal with the quadrature-phase and inverted phase local oscillator signals to output Q-channel in-phase and quadrature-phase high frequency signals, respectively; a first main amplifier and a first auxiliary amplifier respectively amplifying the I-channel in-phase high frequency signal output from the first mixer and the I-channel quadrature-phase high frequency signal output from the second mixer; and a second main amplifier and a second auxiliary amplifier respectively amplifying the Q-channel in-phase high frequency signal output from the third mixer and the Q-channel quadrature-phase high frequency signal output from the fourth mixer.

The signal amplifier may further include: a first phase difference compensator compensating for a phase difference between signals output from the first main amplifier and the first auxiliary amplifier; and a second phase difference compensator compensating for a phase difference between signals output from the second main amplifier and the second auxiliary amplifier.

The signal amplifier may further include a band selection filter passing only specific band frequency components of signals output from the first and second phase difference compensators.

The signal amplifier may further include: a first base band analog filter filtering the I-channel analog signal to remove a high frequency noise component; and a second base band analog filter filtering the Q-channel analog signal to remove a high frequency noise component.

The first and second digital-to-analog converters, the first and second local oscillator signal generators, the first through fourth mixers, the first main amplifier, the first auxiliary amplifier, the second main amplifier, the second auxiliary amplifier, and the first and second base band analog filters may be integrated into an integrated circuit.

The first and second main amplifiers may each operate as one of A and AB class amplifiers, and the first and second auxiliary amplifiers may operate as C class amplifiers.

According to yet another aspect of the present invention, there is provided a direct conversion transmitter including: first and second digital-to-analog converters respectively converting input I-channel and Q-channel digital signals into I-channel and Q-channel analog signals; a local oscillator signal generator outputting an in-phase local oscillator signal, a quadrature-phase local oscillator signal, and an inverted phase local oscillator signal; first and second mixers mixing the I-channel analog signal with the in-phase and quadrature-phase local oscillator signals to output I-channel in-phase and quadrature-phase high frequency signals; third and fourth mixers mixing the Q-channel analog signal with the quadrature-phase and inverted phase local oscillator signals to output Q-channel in-phase and quadrature-phase high frequency signals; a first main amplifier and a first auxiliary amplifier respectively amplifying the I-channel in-phase high frequency signal output from the first mixer and the I-channel quadrature-phase high frequency signal output from the second mixer; a second main amplifier and a second auxiliary amplifier respectively amplifying the Q-channel in-phase high frequency signal output from the third mixer and the Q-channel quadrature-phase high frequency signal output from the fourth mixer; a first phase difference compensator compensating for a phase difference between signals output from the first main and auxiliary amplifiers and then coupling and outputting the signals; a second phase difference compensator compensating for a phase difference between signals output from the second main and auxiliary amplifiers; and an antenna radiating signals output from the first and second phase difference compensators in the air to transmit the signals to a receiver.

The direct conversion transmitter may further include: a first base band analog filter filtering the I-channel analog signal to remove a high frequency noise component; and a second base band analog filter filtering the Q-channel analog signal to remove a high frequency noise component.

The direct conversion transmitter may still further include a band selection filter passing only specific band frequency components of signals output from the first and second phase difference compensators.

The first and second main amplifiers may each operate as one of A and AB class amplifiers, and the first and second auxiliary amplifiers may operate as C class amplifiers.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1:
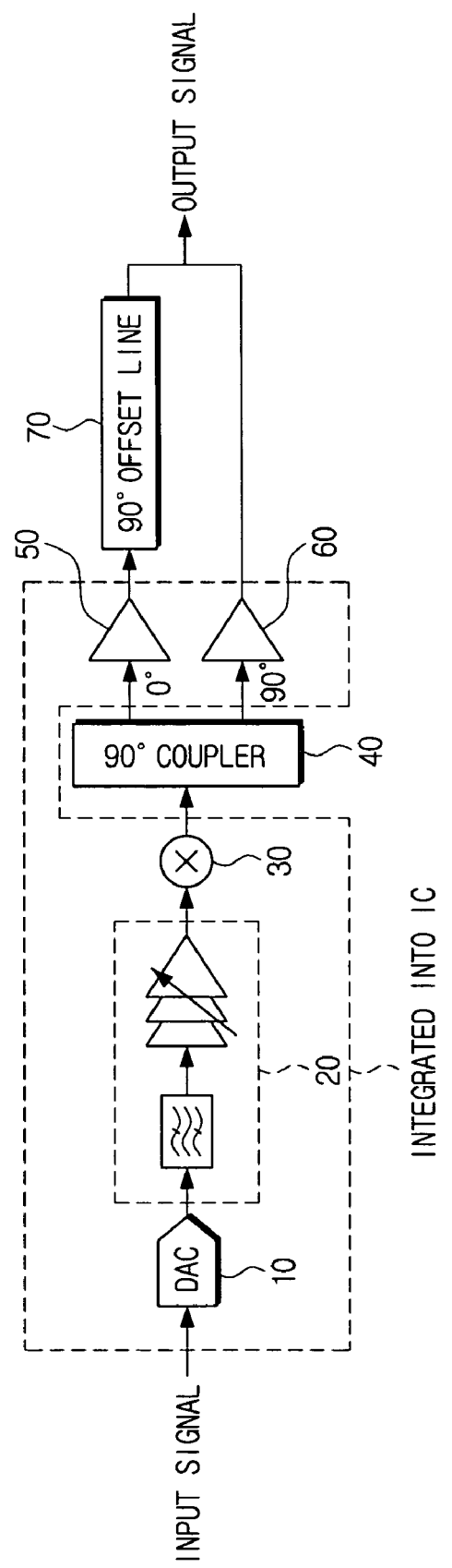
FIG. 1 is a schematic block diagram of a transmitter using a related Doherty structure.
Figure 2:
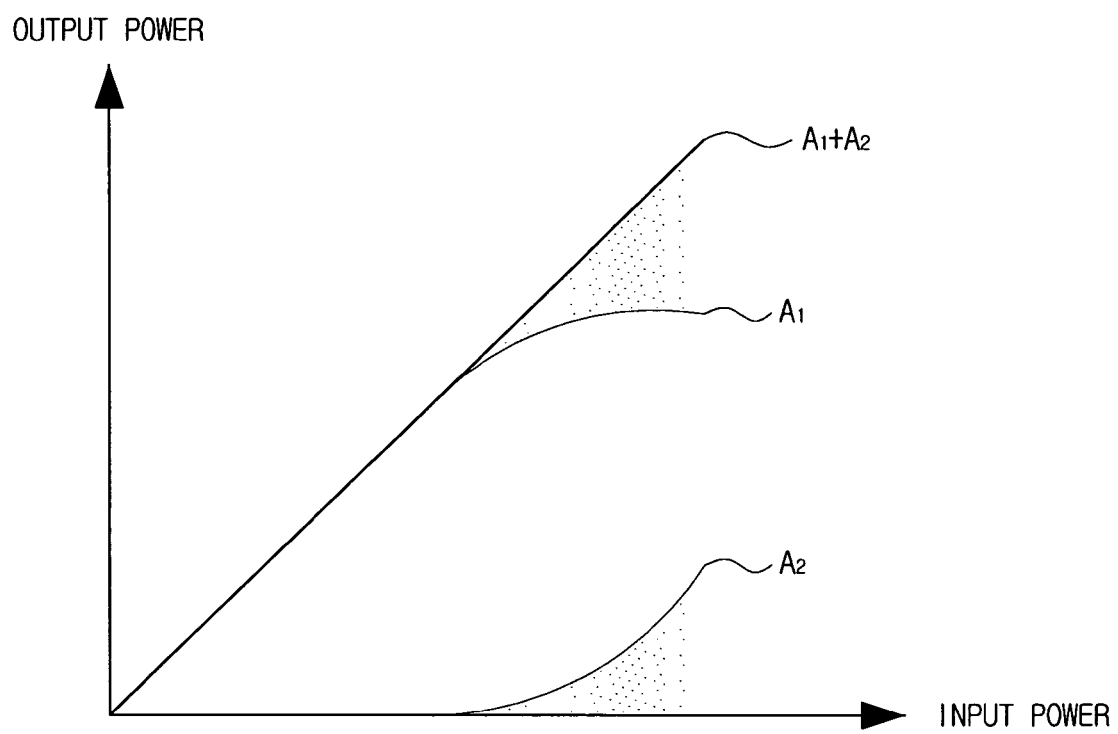
FIG. 2 is a graph illustrating an output power with respect to an input power in a related art Doherty structure.

Certain exemplary embodiments of the present invention will be described in greater detail with reference to the accompanying drawings.

In the following description, the same drawing reference numerals are used for the same elements throughout the drawings. The matters defined in the description are only provided to assist understanding of the invention. However, the present invention can be carried out in different manners from those disclosed herein. Also, well-known functions or constructions are not described in detail since they would obscure the invention in unnecessary detail.

Figure 3:
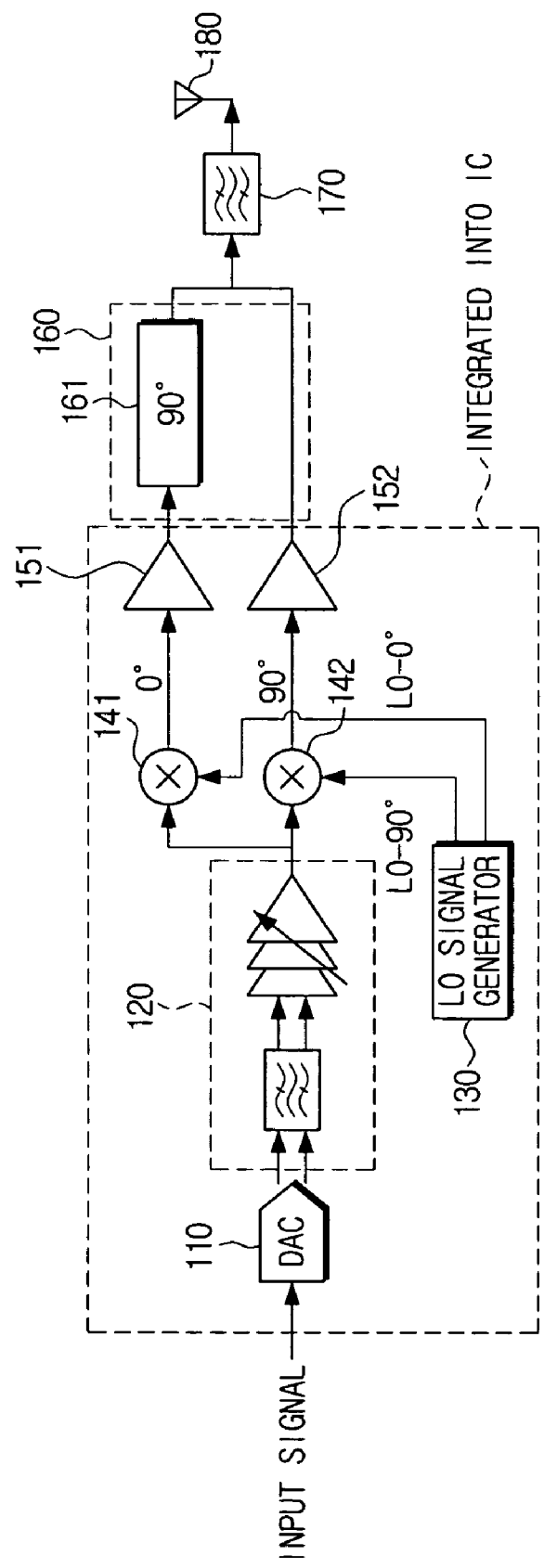
FIG. 3 is a block diagram of a transmitter according to an exemplary embodiment of the present invention.

FIG. 3 is a block diagram of a transmitter according to an exemplary embodiment of the present invention. Referring to FIG. 3, the transmitter includes a DAC 110, a base band analog filter 120, a local oscillator (LO) signal generator 130, first and second mixers 141 and 142, a main amplifier 151, and a peak amplifier 152, a phase difference compensator 160, a band selection filter 170, and an antenna 180.

The DAC 110 converts a an input digital signal into an analog signal.

The base band analog filter 120 filters the analog signal to remove a high frequency noise component and pass only a base band signal and amplifies the analog signal to provide the amplified analog signal to the first and second mixers 141 and 142.

The LO signal generator 130 outputs an in-phase LO signal LO-0° and a quadrature-phase LO signal LO-90°. The LO signal generator 130 may include an LO signal generator generating an LO signal and a phase converter (not shown) converting the LO signal into the in-phase LO signal LO-0° and the quadrature-phase LO signal LO-90° about 90° out of phase with each other.

The first mixer 141 mixes the signal output from the base band analog filter 120 with the in-phase LO signal LO-0° to output an in-phase high frequency signal.

The second mixer 142 mixes the signal output from the base band analog filter 120 with the quadrature-phase LO signal LO-90° to output a quadrature-phase high frequency signal.

The main amplifier 151 may be realized as a power amplifier amplifying and outputting the in-phase high frequency signal, and the peak amplifier 152 may be realized as a power amplifier amplifying and outputting the quadrature-phase high frequency signal. Here, the main amplifier 151 may be realized as an A or AB class amplifier, and the peak amplifier 152 may be realized as a C class amplifier. However, the main and peak amplifiers 151 and 152 are not limited to the A or AB and C class amplifiers. Instead, amplifiers having the same structure and different operation classes may be combined so as to form a Doherty structure.

The phase difference compensator 160 compensates for a phase difference between the in-phase and quadrature-phase high frequency signals respectively amplified by the main and peak amplifiers 151 and 152 so that the in-phase and quadrature-phase high frequency signals are in phase with each other, so as to output a high frequency signal. In detail, the 90° offset transmission line 161 may be used on a path of the in-phase high frequency signal output from the main amplifier 151 to 90° delay a phase of the in-phase high frequency signal so that the in-phase high frequency signal is in phase with the quadrature-phase high frequency signal.

The band selection filter 170 removes a noise component from the high frequency signal output from the phase difference compensator 160 and passes only a frequency component in a specific channel band used in a transmitting and receiving system.

The antenna 180 radiates the high frequency signal output from the band selection filter 170 in the air to transmit the high frequency signal to a receiver (not shown).

In the above-described structure, the first and second mixers 141 and 142 respectively mix the analog signal output from the DAC 110 with the in-phase and quadrature-phase LO signals LO-0° and LO-90° so as to generate the in-phase and quadrature-phase high frequency signals. Also, the first and second mixers 141 and 142 generate the in-phase and quadrature-phase high frequency signals which are 90° out of phase with each other and respectively output the in-phase and quadrature-phase high frequency signals to the main and peak amplifiers 151 and 152 to amplify the in-phase and quadrature-phase high frequency signals. Thus, a signal can be amplified using a Doherty structure without a 90° coupler.

Also, mixers and an LO signal generator generating in-phase and quadrature-phase LO signals 90° out of phase with each other can replace the 90° coupler which is difficult to integrate into an IC. Thus, Radio Frequency Integrated Circuit (RFIC) integration can be achieved for a power amplifier node including main and peak amplifiers.

Figure 4:
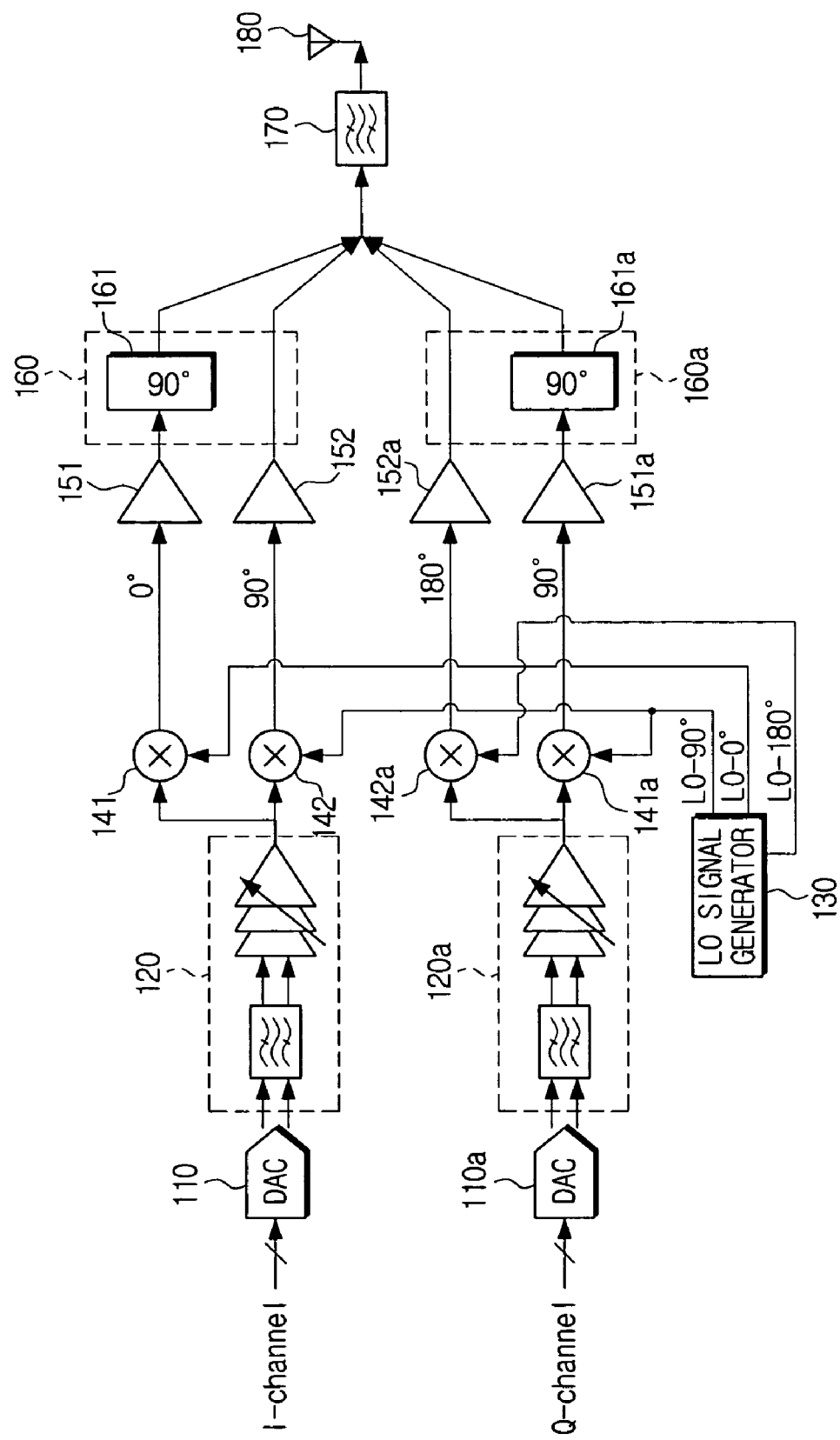
FIG. 4 is a block diagram of a direct conversion transmitter according to another exemplary embodiment of the present invention.

FIG. 4 is a block diagram of a direction conversion transmitter according to another exemplary embodiment of the present invention.

The direct conversion transmitter according to the present exemplary embodiment may be a direct conversion method in which a low frequency signal including substantial information such as audio or video can be directly transmitted with a high frequency carrier without an intermediate process of converting the low frequency signal into an intermediate frequency. The direct conversion method requires a smaller number of parts than other methods and is advantageous to IC integration.

Referring to FIG. 4, the direct conversion transmitter includes a first DAC 110 processing an I-channel digital signal, a first base band analog filter 120, first and second mixers 141 and 142, a first main amplifier 151, a first auxiliary amplifier 152, a first phase difference compensator 160, a second DAC 110a process a Q-channel digital signal, a second base band analog filter 120a, third and fourth mixers 141a and 142a, a second main amplifier 151a, a second auxiliary amplifier 152a, a second phase difference compensator 160a, an LO signal generator 130, a band selection filter 170, and antenna 180.

The first and second DACs 110 and 110a respectively convert the input I-channel and Q-channel digital signals into I-channel and Q-channel analog signals.

The first base band analog filter 120 filters the I-channel analog signals connected by the DAC 110 to remove a high frequency noise component, and the second base band analog filter 120a filters the Q-channel analog signal connected by the DAC 110 to remove a high frequency noise component.

The LO signal generator 130 outputs an in-phase LO signal LO-0°, a quadrature-phase LO signal LO-90°, and an inverted phase LO signal LO-180°. Here, the quadrature-phase LO signal LO-90° is about 90° out of phase with the in-phase LO signal LO-0°, and the inverted phase LO signal LO-180° is about 180° out of phase with the in-phase LO signal LO-0°.

The first and second mixers 141 and 142 respectively mix the I-channel analog signal with the in-phase LO signal LO-0° and the quadrature-phase LO signal LO-90° to respectively output I-channel in-phase and quadrature-phase high frequency signals.

The third and fourth mixers 141*a* and 142*a* mix the Q-channel analog signal with the quadrature-phase LO signal LO signal LO-90° and the inverted phase LO signal LO-180° to respectively output Q-channel in-phase and quadrature-phase high frequency signals.

The first main amplifier 151 and the first auxiliary amplifier 152 respectively amplify and output the I-channel in-phase and quadrature-phase high frequency signals, and the second main amplifier 151*a* and the second auxiliary amplifier 152*a* amplify and output the Q-channel in-phase and quadrature-phase high frequency signals.

The first and second phase difference compensators 160 and 160*a* respectively compensate for phase differences between the I-channel and Q-channel in-phase high frequency signals amplified by the first and second main amplifiers 151 and 151*a* and the I-channel and Q-channel quadrature-phase high frequency signals amplified by the first and second auxiliary amplifiers 152 and 152*a* so that the I-channel and Q-channel in-phase high frequency signals are in phase with the I-channel and Q-channel quadrature-phase high frequency signals, so as to high frequency signals. In more detail, 90° offset transmission lines 161 and 161*a* may be used on paths of the I-channel and Q-channel in-phase high frequency signals output from the first and second main amplifiers 151 and 151*a* to 90° delay the I-channel and Q-channel in-phase high frequency signals so the I-channel and Q-channel in-phase high frequency signals are in phase with the I-channel and Q-channel quadrature-phase high frequency signals.

The band selection filter 170 removes noise components from the high frequency signals output from the first and second phase difference compensator 160 and 160*a* and passes only a frequency component in a specific channel band used in a transmitting and receiving system.

The antenna 180 transmits the high frequency signal passed through the band selection filter 170 to a receiver (not shown).

The transmitter according to the present exemplary embodiment can replace a 90° coupler that is difficult to be integrated into an IC with mixers and an LO signal generator generating in-phase, quadrature-phase, and inverted phase LO signals. Thus, RFIC integration can be achieved for a power amplifier node including main and auxiliary amplifiers.

As described above, according to the present invention, a 90° coupler can be replaced with an LO signal generator and a mixer that can be manufactured using a CMOS process so as to integrate a Doherty structure into an IC. Thus, a transmitter according to the present invention can be compact.

Also, the LO signal generator can process a signal with a wider bandwidth than a signal with a narrow bandwidth processed by the 90° coupler.

In addition, the LO signal generator can be installed in an IC of the transmitter in advance. Thus, only the mixer need be added to the IC of the transmitter. As a result, the transmitter can be realized simply.

The foregoing embodiments are merely exemplary and should not be construed as limiting the present invention. The present teaching can be readily applied to other types of apparatuses. Also, the description of the exemplary embodiments of the present invention is intended to be illustrative, and does not limit the scope of the claims, as many alternatives, modifications, and variations will be apparent to those skilled in the art.

What is claimed is:

1. A signal amplifier comprising: a digital-to-analog converter which converts a digital signal into an analog signal;
   a local oscillator signal generator which generates in-phase and quadrature-phase local oscillator signals;
   a first mixer which mixes the analog signal with the in-phase local oscillator signal and generates an in-phase high frequency signal;
   a second mixer which mixes the analog signal with the quadrature-phase local oscillator signal and generates a quadrature-phase high frequency signal;
   a main amplifier which amplifies only the in-phase high frequency signal outputted by the first mixer; and
   an auxiliary amplifier which amplifies only the quadrature-phase high frequency signal outputted by the second mixer,
   wherein the analog signal having a same phase is split and mixed with the in-phase local oscillator signal in the first mixer and with the quadrature-phase local oscillator signal in the second mixer.

2. The signal amplifier of claim 1, further comprising a phase difference compensator which compensates for a phase difference between signals output from the main and auxiliary amplifiers.

3. The signal amplifier of claim 2, further comprising a band selection filter which passes a specific band frequency component of a signal output from the phase difference compensator.

4. The signal amplifier of claim 1, further comprising a base band analog filter which filters the analog signal to remove a high frequency noise component.

5. The signal amplifier of claim 4, wherein the digital-to-analog converter, the local oscillator signal generator, the first mixer, the second mixer, the main amplifier, the auxiliary amplifier, and the base band analog filter are integrated into an integrated circuit.

6. The signal amplifier of claim 1, wherein the main amplifier operates as one of an A class amplifier and an AB class amplifier, and the auxiliary amplifier operates as a C class amplifier.

7. A transmitter comprising:
   a digital-to-analog converter which converts a digital signal into an analog signal;
   a local oscillator signal generator which generates in-phase and quadrature-phase
   local oscillator signals;
   a first mixer which mixes the analog signal with tile it-phase local oscillator signal
   and generates an in-phase high frequency signal;
   a second mixer which mixes the analog signal with the quadrature-phase local oscillator signal and generates a quadrature-phase high frequency signal;
   a main amplifier which amplifies only the in-phase high frequency signal outputted by the first mixer;
   an auxiliary amplifier which amplifies only the quadrature-phase high frequency signal outputted by the second mixer; and
   a phase difference compensator which compensates for a phase difference
   between signals output from the main and auxiliary amplifiers, and then couples the compensated signals and outputs a coupled signal, wherein the analog signal having a same phase is split and mixed with the in-phase local oscillator signal in the first mixer and with the quadrature-phase local oscillator signal in the second mixer.

8. The transmitter of claim 7, further comprising an antenna which transmits the coupled signal output from the phase difference compensator to a receiver.

9. The transmitter of claim 7, further comprising a base band analog filter which filters the analog signal to remove a high frequency noise component.

10. The transmitter of claim 7, further comprising a band selection filter which passes a specific band frequency component of the coupled signal output from the phase difference compensator.

11. The transmitter of claim 7, wherein the main amplifier operates as one of an A class amplifier and an AB class amplifier, and the auxiliary amplifier operates as a C class amplifier.

12. A signal amplifier comprising:
    a first digital-to-analog converter which converts an I-channel digital signal into an I-Channel analog signal;
    a second digital-to-analog converter which converts a Q-channel digital signal into a Q-channel analog signal;
    a local oscillator signal generator which outputs an in-phase local oscillator signal, a quadrature-phase local oscillator signal, and an inverted phase local oscillator signal;
    a first mixer which mixes the I-channel analog signal with the in-phase local oscillator signal to generate an I-channel in-phase high frequency signal;
    a second mixers which mixes the I-channel analog signal with the quadrature-phase local oscillator signal to generate an I-channel quadrature-phase high frequency signal;
    wherein the I-channel analog signal having a same phase is split and input to the first mixer and the second mixer;
    a third mixer which mixes the Q-channel analog signal with the quadrature-phase local oscillator signal to generate a Q-channel in-phase high frequency signal;
    a fourth mixer which mixes the Q-channel analog signal with the inverted phase local oscillator signal to generate a Q-channel quadrature-phase high frequency signal;
    wherein the Q-channel analog signal having a same phase is split and input to the third mixer and the fourth mixer;
    a first main amplifier which amplifies only the I-channel in-phase high frequency signal outputted by the first mixer;
    a first auxiliary amplifier which amplifies only the I-channel quadrature-phase high frequency signal outputted by the second mixer;
    a second main amplifier which amplifies only the Q-channel in-phase high frequency signal outputted by the third mixer; and
    a second auxiliary amplifier which amplifies only the Q-channel quadrature-phase high frequency signal outputted by the fourth mixer.

13. The signal amplifier of claim 12, further comprising:
    a first phase difference compensator which compensates for a phase difference between signals output from the first main amplifier and the first auxiliary amplifier; and
    a second phase difference compensator which compensates for a phase difference between signals output from the second main amplifier and the second auxiliary amplifier.

14. The signal amplifier of claim 13, further comprising a band selection filter which passes specific band frequency components of signals output from the first and second phase difference compensators.

15. The signal amplifier of claim 12, further comprising:
    a first base band analog filter which filters the I-channel analog signal to remove a high frequency noise component; and
    a second base band analog filter which filters the Q-channel analog signal to remove a high frequency noise component.

16. The signal amplifier of claim 15, wherein the first and second digital-to-analog converters, the first and second local oscillator signal generators, the first through fourth mixers, the first main amplifier, the first auxiliary amplifier, the second main amplifier, the second auxiliary amplifier, and the first and second base band analog filters are integrated into an integrated circuit.

17. The signal amplifier of claim 12, wherein the first and second main amplifiers each operate as one of an A class amplifier and an AB class amplifier, and the first and second auxiliary amplifiers operate as C class amplifiers.

18. A direct conversion transmitter comprising:
    a first digital-to-analog converter which converts an I-channel digital signal into an I-channel analog signal;
    a second digital-to-analog converter which converts a Q-channel digital signal into a Q-channel analog signal;
    a local oscillator signal generator which generates and in-phase local oscillator signal, a quadrature-phase local oscillator signal, and an inverted phase local oscillator signal;
    a first mixer which mixes the I-channel analog signal with the in-phase local oscillator signal to generate an I-channel in-phase high frequency signal;
    a second mixer which mixes the I-channel analog signal with the quadrature-phase local oscillator signal to generate an I-channel quadrature-phase high frequency signal;
    wherein the I-channel analog signal having a same phase is split and input to the first mixer and the second mixer;
    a third mixer which mixes the Q-channel analog signal with the quadrature-phase local oscillator signal to output a Q-channel in-phase high frequency signal;
    a fourth mixer which mixes the Q-channel analog signal with the inverted phase local oscillator signal to output a Q-channel quadrature-phase high frequency signal;
    wherein the Q-channel analog signal having a same phase is split and input to the third mixer and the fourth mixer;
    a first main amplifier which amplifies only the I-channel in-phase high frequency signal outputted by the first mixer;
    a first auxiliary amplifier which amplifies only the I-channel quadrature-phase high frequency signal outputted by the second mixer;
    a second main amplifier which amplifies only the Q-channel in-phase high frequency signal outputted by the third mixer;
    a second auxiliary amplifier which amplifies only the Q-channel quadrature-phase high frequency signal outputted by the fourth mixer;
    a first phase difference compensator which compensates for a phase difference between signals output from the first main and auxiliary amplifiers and then couples and outputs the signals;
    a second phase difference compensator which compensates for a phase difference between signals output from the second main and auxiliary amplifiers.

19. The transmitter of claim 18, further comprising an antenna which transmits signals output from the first and second phase difference compensators to a receiver.

20. The direct conversion transmitter of claim 18, further comprising:
- a first base band analog filter which filters the I-channel analog signal to remove a high frequency noise component; and
- a second base band analog filter which filters the Q-channel analog signal to remove a high frequency noise component.

21. The direct conversion transmitter of claim 18, further comprising a band selection filter which passes specific band frequency components of signals output from the first and second phase difference compensators.

22. The direct conversion transmitter of claim 18, wherein the first and second main amplifiers each operate as one of an A class amplifier and an AB class amplifier, and the first and second auxiliary amplifiers operate as C class amplifiers.

23. The signal amplifier of claim 2, wherein the phase difference compensator changes a phase of one of the signals output from the main and auxiliary amplifiers by 90 degrees.

* * * * *